(12) United States Patent
Sato et al.

(10) Patent No.: US 7,486,542 B2
(45) Date of Patent: Feb. 3, 2009

(54) GENERAL PURPOSE REGISTER CIRCUIT

(75) Inventors: Eiji Sato, Kawasaki (JP); Toshimasa Kawaai, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 15 days.

(21) Appl. No.: 11/748,170

(22) Filed: May 14, 2007

(65) Prior Publication Data
US 2007/0263427 A1     Nov. 15, 2007

(30) Foreign Application Priority Data
May 15, 2006  (JP)  ............................ 2006-134912

(51) Int. Cl.
 *G11C 11/40* (2006.01)
(52) U.S. Cl. .............. 365/154; 365/189.02; 365/189.05
(58) Field of Classification Search ............. 365/189.12
See application file for complete search history.

(56) References Cited

U.S. PATENT DOCUMENTS

| | | | |
|---|---|---|---|
| 5,042,014 A | * | 8/1991 | Pinkham et al. ........ 365/230.05 |
| 5,321,651 A | * | 6/1994 | Monk .................... 365/189.15 |
| 5,638,526 A | | 6/1997 | Nakada |
| 6,262,938 B1 | * | 7/2001 | Lee et al. ............... 365/233.12 |
| 6,405,293 B1 | * | 6/2002 | Chiang et al. ............... 711/154 |
| 7,126,858 B1 | * | 10/2006 | Yuan et al. ............ 365/189.02 |

FOREIGN PATENT DOCUMENTS

JP          7-210382          8/1995

\* cited by examiner

*Primary Examiner*—Tan T. Nguyen
(74) *Attorney, Agent, or Firm*—Oblon, Spivak, McClelland, Maier & Neustadt, P.C.

(57) ABSTRACT

A general purpose register circuit that stores and outputs desired data as required by a program stored in a storage device, has a memory cell which is connected to a word line and a bit line for writing and reading of the data; and a multiplexer circuit which is connected to the bit line at an input thereof and to a control line for transmitting an output selection signal and selectively outputs one of the value of the data read from the memory cell and input thereto via the bit line and a fixed value, according to the output selection signal input thereto.

9 Claims, 3 Drawing Sheets

GENERAL PURPOSE REGISTER CIRCUIT

CROSS-REFERENCE TO RELATED APPLICATION

This application is based upon and claims the benefit of priority from the prior Japanese Patent Application No. 2006-134912, filed on May 15, 2006, the entire contents of which are incorporated herein by reference.

BACKGROUND OF THE INVENTION

1. Field of the Invention

The present invention relates to a general purpose register circuit that stores and outputs desired data.

2. Background Art

Data memories include readable and writable memories dedicated to data storage, which are to be provided independently of program memories.

The data memories are generally classified into the following two types, both of which are readable and writable.

One type is a special function register (SFR) that stores data for specifying functions and operations of the central processing unit (CPU) and peripheral devices.

The other is a general purpose register (GPR) that serves as a general purpose data area and is used as a variable data area or a buffer.

When a circuit, such as a microprocessor, that has such a conventional general purpose register uses a particular value, the circuit first reads a value from the general purpose register circuit to create the particular value. Then, a computing unit processes the value by a calculation. Then, the result of the computational processing is written to the general purpose register circuit. Then, the circuit reads the written value for use. The circuit may use the value before the value is written to the general purpose register circuit.

However, as described above, in order to obtain a desired output from the general purpose register circuit, the value read from the general purpose register circuit has to be processed by performing a calculation, and therefore, there is a problem that it is difficult to increase the signal output rate to a desired level.

A conventional register has a multiplexer, a D-type flip flop that receives the output of the multiplexer at the D terminal thereof, and an AND gate that outputs a signal for selecting the output of the multiplexer based on a signal for selecting a register circuit to be modified and a signal for selecting the output of the multiplexer. The multiplexer receives the output signal of the D-type flip flop and a signal that defines the final state of the register circuit.

With such a configuration, when states of a plurality of registers have to be modified, a single command can be written to modify the status of multiple bits. In this way, when the status of a plurality of register circuits has to be modified, the software overhead is reduced (see Japanese Patent Laid-Open Publication No. 7-210382, for example).

However, even the conventional register described above still has to process the value read from the D-type flip flop by a calculation in order to provide a desired output. Thus, it is difficult to increase the signal output rate to a desired level.

SUMMARY OF THE INVENTION

According one aspect of the present invention, there is provided: a general purpose register circuit that stores and outputs desired data as required by a program stored in a storage device, comprising a memory cell which is connected to a word line and a bit line for writing and reading of the data; and a multiplexer circuit which is connected to the bit line at an input thereof and to a control line for transmitting an output selection signal and selectively outputs one of the value of the data read from the memory cell and input thereto via the bit line and a fixed value, according to the output selection signal input thereto.

DETAILED DESCRIPTION

A general purpose register circuit according to the present invention is to be mounted on a microprocessor, for example, and stores and outputs desired data as required by a program in use.

In the following, an embodiment of the present invention will be described with reference to the drawings.

Embodiment

Figure 1:
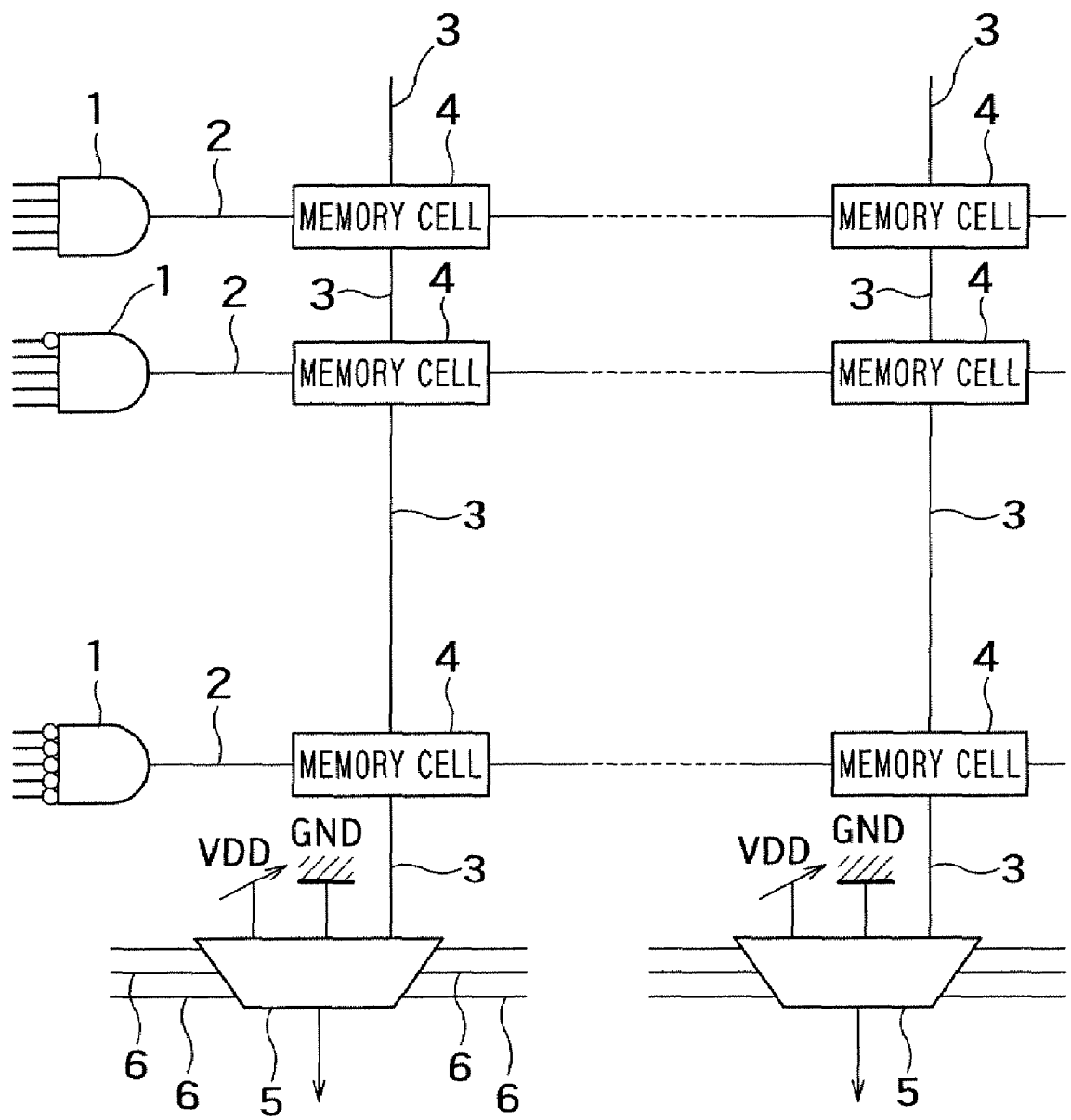
FIG. 1 is a block diagram showing a configuration of essential parts of a general purpose register circuit according to an embodiment of the present invention.
Figure 2:
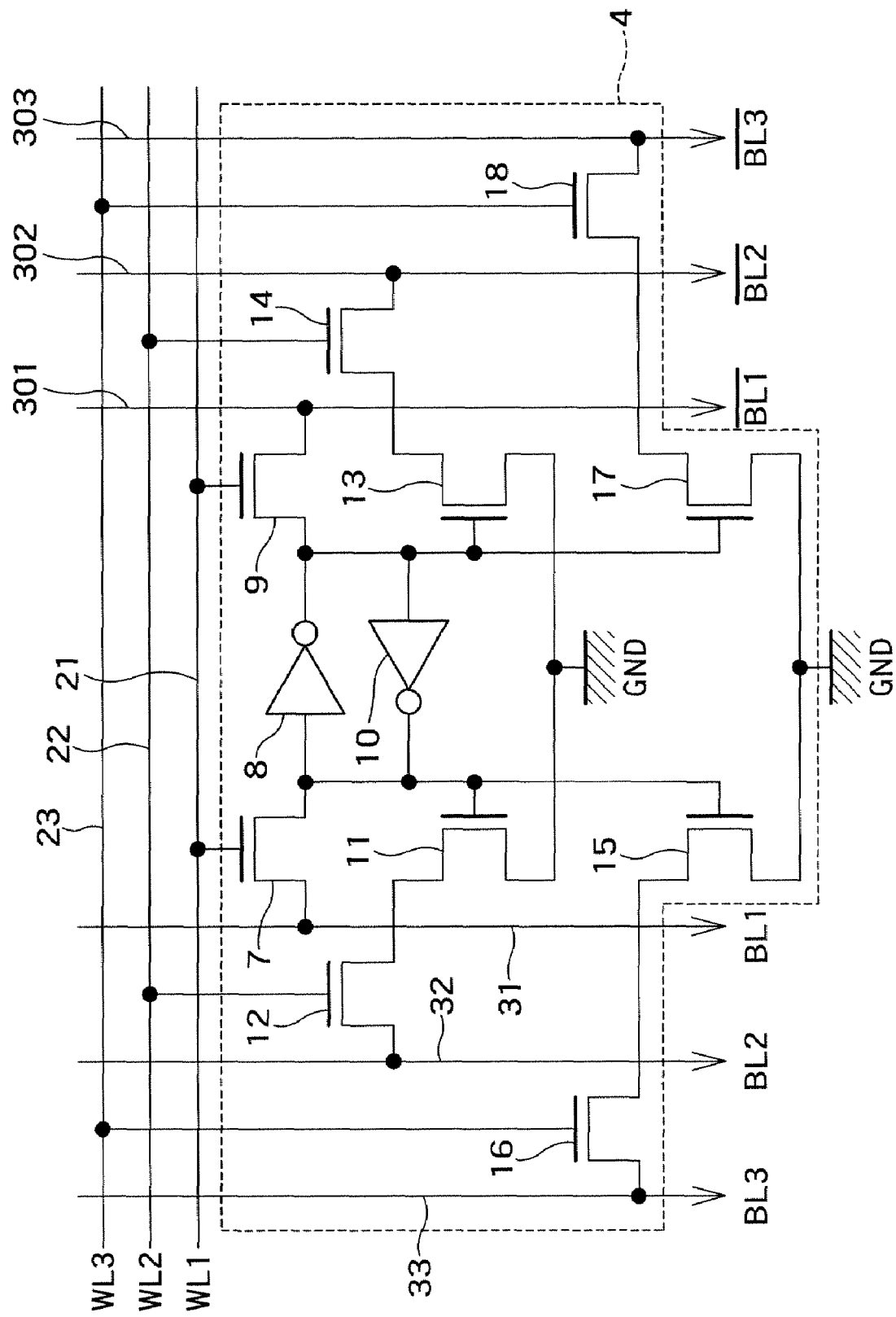
FIG. 2 is a circuit diagram showing a configuration of a memory cell in the general purpose register circuit shown in FIG. 1.

FIG. 1 is a block diagram showing a configuration of essential parts of a general purpose register circuit according to an embodiment of the present invention. FIG. 2 is a circuit diagram showing a configuration of a memory cell in the general purpose register circuit shown in FIG. 1.

As shown in FIG. 1, a general purpose register circuit 100 has a plurality of memory cells 4 arranged in a matrix, each of which is connected to a word line 2 connected to the output of an AND circuit 1 and is connected to a bit line 3 connected to the output of a precharge circuit (not shown), and a plurality of multiplexer circuits 5 each of which is connected to a bit line 3 at an input thereof and to a control line 6 that transmits an output selection signal.

The AND circuit 1 performs a calculation on the input signal and outputs, to the word line 2, a signal for writing data to, for erasing data in and reading data from the memory cell 4.

The multiplexer circuit 5 selectively outputs one of a fixed value and data that is read from the memory cell 4 and input thereto via the bit line 3, according to the output selection signal according to the requirement of the program input thereto via the control line 6.

The fixed value is determined based on at least one of a power supply potential "VDD" and a ground potential "GND".

As shown in FIG. 2, the word line 2 has a first word line 21 for writing data to and for erasing data in the memory cell 4 and second word lines 22, 23 for reading data from the memory cell 4.

The bit line 3 has first bit lines 31, 301 for writing data to and for erasing data in the memory cell 4 and second bit lines 32, 33, 302, 303 for reading data from the memory cell 4.

The memory cell 4 may, for example, be a static random access memory (SRAM).

The memory cell 4 has a first MOS transistor 7 that is connected to the first word line 21 at the gate thereof and to the first bit line 31 at the source thereof, a first inverter 8 that is connected to the drain of the first MOS transistor 7 at the input thereof, a second MOS transistor 9 that is connected to the output of the first inverter 8 at the source thereof, to the first word line 21 at the gate thereof and to the first bit line 301, to which a signal inverted from the signal on the first bit line 31 is input, at the drain thereof, and a second inverter 10 that is connected to the input of the first inverter 8 at the output thereof and to the output of the inverter 8 at the input thereof.

The memory cell 4 further has a third MOS transistor 11 that is connected to the drain of the first MOS transistor 7 at the gate thereof and to the ground potential at the source thereof and a fourth MOS transistor 12 that is connected to the drain of the third MOS transistor 11 at the source thereof, to the second word line 22 at the gate thereof and to the second bit line 32 at the drain thereof.

The memory cell 4 further has a fifth MOS transistor 13 that is connected to the source of the second MOS transistor 9 at the gate thereof and to the ground potential at the source thereof and a sixth MOS transistor 14 that is connected to the drain of the fifth MOS transistor 13 at the source thereof, to the second word line 22 at the gate thereof, and to the second bit line 302, to which a signal inverted from the signal on the second bit line 32 is input, at the drain thereof.

The memory cell 4 further has a seventh MOS transistor 15 that is connected to the drain of the first MOS transistor 7 at the gate thereof and to the ground potential at the source thereof and an eighth MOS transistor 16 that is connected to the drain of the seventh MOS transistor 15 at the source thereof, to the second word line 23 at the gate thereof and to the second bit line 33 at the drain thereof.

The memory cell 4 further has a ninth MOS transistor 17 that is connected to the source of the second MOS transistor 9 at the gate thereof and to the ground potential at the source thereof and a tenth MOS transistor 18 that is connected to the drain of the ninth MOS transistor 17 at the source thereof, to the second word line 23 at the gate thereof and to the second bit line 303, to which a signal inverted from the signal on the second bit line 33 is input, at the drain thereof.

While the MOS transistors have been described as nMOS transistors, pMOS transistors may be used. Furthermore, depending on the circuit to which the general purpose register circuit 100 is applied, the fifth to tenth MOS transistors 13 to 18 may be omitted.

Now, write, erase and read operations of the memory cell 4 configured as described above will be described.

Data write and erase operations of the memory cell 4 are performed by controlling the potentials of the terminals of the first and second inverters 8 and 10 by a signal "WL1" input to the first word line 21, a signal "BL1" input to the first bit line 31 and an inverted signal of the signal "BL1" input to the first bit line 301.

On the other hand, data read operation of the memory cell 4 is performed in the following manner. That is, if the voltage applied to the gate of the third MOS transistor 11, which depends on the potentials of the terminals of the first and second inverters 8 and 10, is equal to or higher than a threshold value, when the fourth MOS transistor 12 is turned on by a signal "WL2" input to the second word line 22, a signal "BL2" at the ground potential is output to the second bit line 32. If the voltage applied to the gate of the third MOS transistor 11, which depends on the potentials of the terminals of the first and second inverters 8 and 10, is equal to or lower than the threshold value, when the fourth MOS transistor 12 is turned on by the signal "WL2" input to the second word line 22, a signal "BL2" at the potential of the drain of the third MOS transistor 11 is output to the second bit line 32.

Similarly, signals are output to the other second bit lines 33, 302 and 303.

The general purpose register circuit 100 configured as described above can selectively output one of the output of the memory cells 4 and a fixed value, such as "0" or "1" by controlling the multiplexer circuits 5 by the output selection signal.

Furthermore, the multiplexer circuits 5 may be designed to always read a certain fixed value. If the fixed value is one frequently used, the coding efficiency is advantageously improved.

Now, comparison between the general purpose register circuit 100 according to the embodiment of the present invention and a conventional general purpose register circuit will be discussed in terms of operation of outputting a desired signal.

Figure 3:
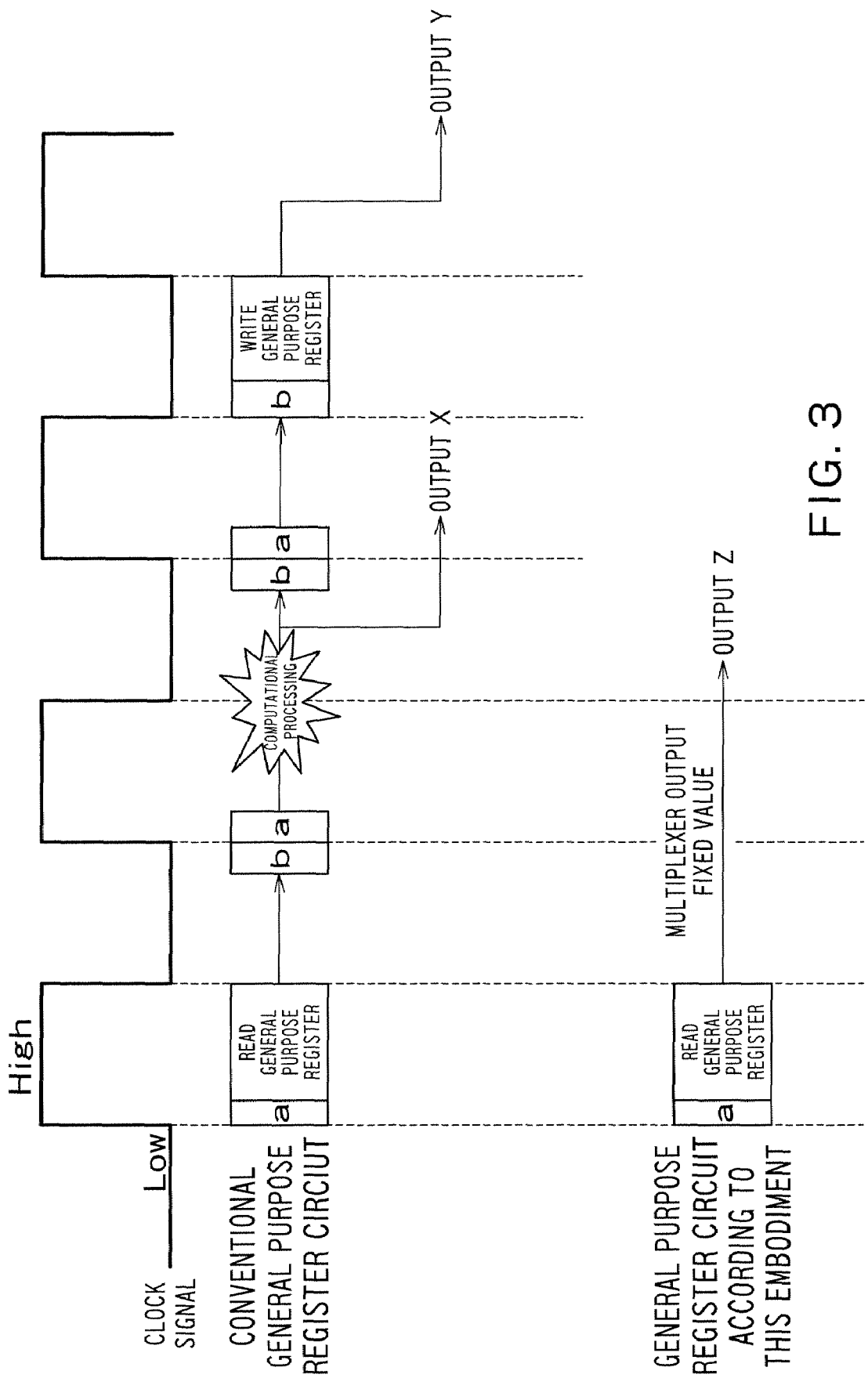
FIG. 3 is a diagram illustrating operations of outputting a desired signal of the general purpose register circuit according to the embodiment of the present invention and a conventional general purpose register circuit.

FIG. 3 is a diagram illustrating operations of outputting a desired signal of the general purpose register circuit according to the embodiment of the present invention and a conventional general purpose register circuit. In FIG. 3, the conventional general purpose register circuit and the general purpose register circuit according to this embodiment perform a sequence of operations in synchronization with clock signals "Low" and "High" by the action of a high-through latch "a" and a low-through latch "b".

As shown in FIG. 3, when the conventional general purpose register circuit outputs a particular value, a value is read from the general purpose register circuit to create the particular value under the instruction of a program in the microprocessor, for example. Then, a computing unit processes the read value by performing a calculation. Then, the result of the processing (the particular value) is written to the general purpose register circuit. Then, the written value is read from the general purpose register circuit and output. Alternatively, the value resulting from the computational processing may be output before the value is written to the general purpose register circuit.

In this way, in order for the conventional general purpose register circuit to provide a desired output, the value read from the general purpose register has to be processed by a calculation. Thus, it is difficult to increase the output rate.

To the contrary, in the case of the general purpose register circuit 100 according to this embodiment, a value is first read from the general purpose register circuit 100, and an appropriate one of the read value and a fixed value is selectively output without processing the read value, according to an instruction of the program of the microprocessor, for example.

Therefore, the general purpose register circuit 100 can output signals at a higher rate than the conventional general purpose register circuit.

As described above, according to this embodiment, the signal output rate of the general purpose register circuit can be increased to a desired level.

In the embodiment described above, a configuration register or the like not in use in the microprocessor may be used to output the output selection signal to the control line 6, thereby controlling the output of the multiplexer circuits 5.

Furthermore, the multiplexer circuit 5 may be controlled by a control signal from an external circuit (not shown).

What is claimed is:

1. A general purpose register circuit that stores and outputs desired data as required by a program stored in a storage device, comprising:

a memory cell which is connected to a word line and a bit line for writing and reading of the data; and a multiplexer circuit which is connected to the bit line at an input thereof and to a control line for transmitting an output selection signal and selectively outputs one of the value of the data read from the memory cell and input thereto via the bit line and a fixed value, according to the output selection signal input thereto, wherein the fixed value is determined based on at least any of a power supply potential and a ground potential.

2. The general purpose register circuit according to claim 1, wherein the multiplexer circuit selectively output one of the data and the fixed value under the control of the output selection signal according to a requirement of the program.

3. The general purpose register circuit according to claim 2, wherein the memory cell is SRAM.

4. The general purpose register circuit according to claim 2, wherein the multiplexer circuit is controlled by a control signal from an external circuit.

5. The general purpose register circuit according to claim 1, wherein the memory cell is SRAM.

6. The general purpose register circuit according to claim 1, wherein the multiplexer circuit is controlled by a control signal from an external circuit.

7. A general purpose register circuit that stores and outputs desired data as required by a program stored in a storage device, comprising:

a memory cell which is connected to a word line and a bit line for writing and reading of the data; and a multiplexer circuit which is connected to the bit line at an input thereof and to a control line for transmitting an output selection signal and selectively outputs one of the value of the data read from the memory cell and input thereto via the bit line and a fixed value, according to the output selection signal input thereto, wherein the multiplexer circuit selectively output one of the data and the fixed value under the control of the output selection signal according to a requirement of the program.

8. The general purpose register circuit according to claim 7, wherein the memory cell is SRAM.

9. The general purpose register circuit according to claim 7, wherein the multiplexer circuit is controlled by a control signal from an external circuit.

* * * * *